United States Patent
Knauer et al.

(10) Patent No.: US 9,595,815 B2
(45) Date of Patent: Mar. 14, 2017

(54) TERMINAL BLOCK FOR INTERCONNECTION OF DPGS POWER AND COMMUNICATIONS VIA METER COLLAR

(71) Applicant: ConnectDER LLC, Falls Church, VA (US)

(72) Inventors: Jon Knauer, Falls Church, VA (US); John Schroeder, Falls Church, VA (US); Al Iaconangelo, Falls Church, VA (US); Josh Konstantinos, Falls Church, VA (US); Ben Lewis, Falls Church, VA (US); Adam Koeppel, Falls Church, VA (US); Whit Fulton, Falls Church, VA (US)

(73) Assignee: ConnectDER LLC, Falls Church, VA (US)

( * ) Notice: Subject to any disclaimer, the term of this patent is extended or adjusted under 35 U.S.C. 154(b) by 0 days.

(21) Appl. No.: 14/709,715

(22) Filed: May 12, 2015

(65) Prior Publication Data

US 2015/0325984 A1   Nov. 12, 2015

Related U.S. Application Data

(60) Provisional application No. 61/991,903, filed on May 12, 2014.

(51) Int. Cl.
*H02B 1/00*  (2006.01)
*H02B 1/04*  (2006.01)
(Continued)

(52) U.S. Cl.
CPC ............. *H02B 1/04* (2013.01); *G01R 11/04* (2013.01); *H01R 33/90* (2013.01); *H02B 1/03* (2013.01);
(Continued)

(58) Field of Classification Search
None
See application file for complete search history.

(56) References Cited

U.S. PATENT DOCUMENTS 2,606,232 A * 8/1952 St John ............... G01R 11/04
                                                    200/51.1
4,977,482 A * 12/1990 Langdon ............. H02B 1/03
                                                    324/156
(Continued)

*Primary Examiner* — Courtney Smith
*Assistant Examiner* — Zhengfu Feng
(74) *Attorney, Agent, or Firm* — Brundidge & Stanger, P.C.

(57) ABSTRACT

Technologies are generally described for a pocket junction box system. In an example, a pocket junction box is configured to fit inside a meter collar. The pocket junction box includes a first set of electrical terminals on a rear surface of the pocket junction box for interfacing with wire leads inside the meter collar, and a second set of electrical terminals on a front surface of the pocket junction box for interfacing with field wire leads outside the meter collar. The pocket junction box may further include at least one current transducer and at least one microprocessor for monitoring the power flow through the pocket junction box. A front casing is attached to the front surface of the pocket junction box and connected to the second set of electrical terminals. The front casing may include a communications circuit board for communicating with a meter data management system.

17 Claims, 9 Drawing Sheets

(51) Int. Cl.
  *H02B 1/20* (2006.01)
  *H02B 1/28* (2006.01)
  *H02B 1/06* (2006.01)
  *H02B 1/03* (2006.01)
  *G01R 11/04* (2006.01)
  *H01R 33/90* (2006.01)
  *H02J 3/38* (2006.01)
  *H02G 3/16* (2006.01)
  *H02G 5/08* (2006.01)
  *G01D 4/00* (2006.01)

(52) U.S. Cl.
  CPC .............. *H02B 1/063* (2013.01); *H02B 1/20* (2013.01); *H02B 1/28* (2013.01); *H02G 3/16* (2013.01); *H02G 5/08* (2013.01); *H02J 3/38* (2013.01); *G01D 4/00* (2013.01)

(56) References Cited

U.S. PATENT DOCUMENTS

| | | | | |
|---|---|---|---|---|
| 5,590,179 | A * | 12/1996 | Shincovich | G01D 4/004 340/870.03 |
| 5,898,387 | A * | 4/1999 | Davis | G01R 11/04 340/637 |
| 6,074,246 | A * | 6/2000 | Seefeldt | H02B 1/03 220/664 |
| 6,188,145 | B1 * | 2/2001 | Stewart | G01R 11/02 307/125 |
| 6,200,158 | B1 * | 3/2001 | Robinson | H01R 13/6397 439/146 |
| 7,040,920 | B2 * | 5/2006 | Johnson, Jr. | G01R 22/065 439/146 |
| 7,182,632 | B1 * | 2/2007 | Johnson, Jr. | G01R 22/065 439/146 |
| 7,315,442 | B2 * | 1/2008 | Robinson | G01R 11/04 324/156 |

* cited by examiner

TERMINAL BLOCK FOR INTERCONNECTION OF DPGS POWER AND COMMUNICATIONS VIA METER COLLAR

BACKGROUND

Distributed power generation systems (alternatively "DPGS") are typically small power generators that are connected directly to local electric distribution grids. Examples of a DPGS may include solar cell arrays, battery or fuel-cell storage systems, electric vehicles, and small wind turbines. As developments in DPGS technologies progress, associated costs continue to decrease and performance efficiencies continue to improve. As a result, some customers of commercial electric utility companies have expressed a preference for using power which they, the customers, generate or store locally, or on-site.

Among the problems that may confront a utility or utility customer seeking to install a DPGS at a customer site may include modifications in wiring of the customer's private electrical distribution system (the "load-side" network) to accommodate the DPGS at the customer's residence. The installation of new dedicated electrical circuits that comply with necessary safety codes and standards often incur significant expenditures of time and money. Another problem is that the customer's electrical distribution system should either be isolated from the utility company's power lines, or connected to the power lines in a carefully controlled manner, when the on-site DPGS is used. The isolation option prevents possible damage to the utility company's distribution system and to the loads of other customers.

Meter collars may be used to alleviate these issues by interconnecting DPGS production on the line-side of the service disconnecting means. However, a safe and cost effective configuration of meter collars to accept field wiring is required.

SUMMARY

In an example, a collar for a watt-hour meter may include a pocket junction box system that enables external termination of field wiring that connects a DPGS to a residential or business structure or to the distribution grid, while maintaining compliance to interconnection requirements for safety, power quality, and automatic disconnect capabilities. The pocket junction box system may also provide for environmental sealing, attachment of a cover to prevent exposure to live parts, and may contain internal mounts to interface with energy monitoring and data communication accessories housed within the cover of the pocket junction box.

In another example, a pocket junction box may be configured to fit inside a meter collar. The pocket junction box may include a first set of electrical terminals on a rear surface of the pocket junction box for interfacing with wire leads inside the meter collar, and a second set of electrical terminals on a front surface of the pocket junction box for interfacing with field wire leads outside the meter collar. The pocket junction box may further include at least one current transducer and at least one microprocessor for monitoring the power flow through the pocket junction box. A front casing may be attached to the front surface of the pocket junction box and connected to the second set of electrical terminals. The front casing may include a communications circuit board for communicating with a meter data management system.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
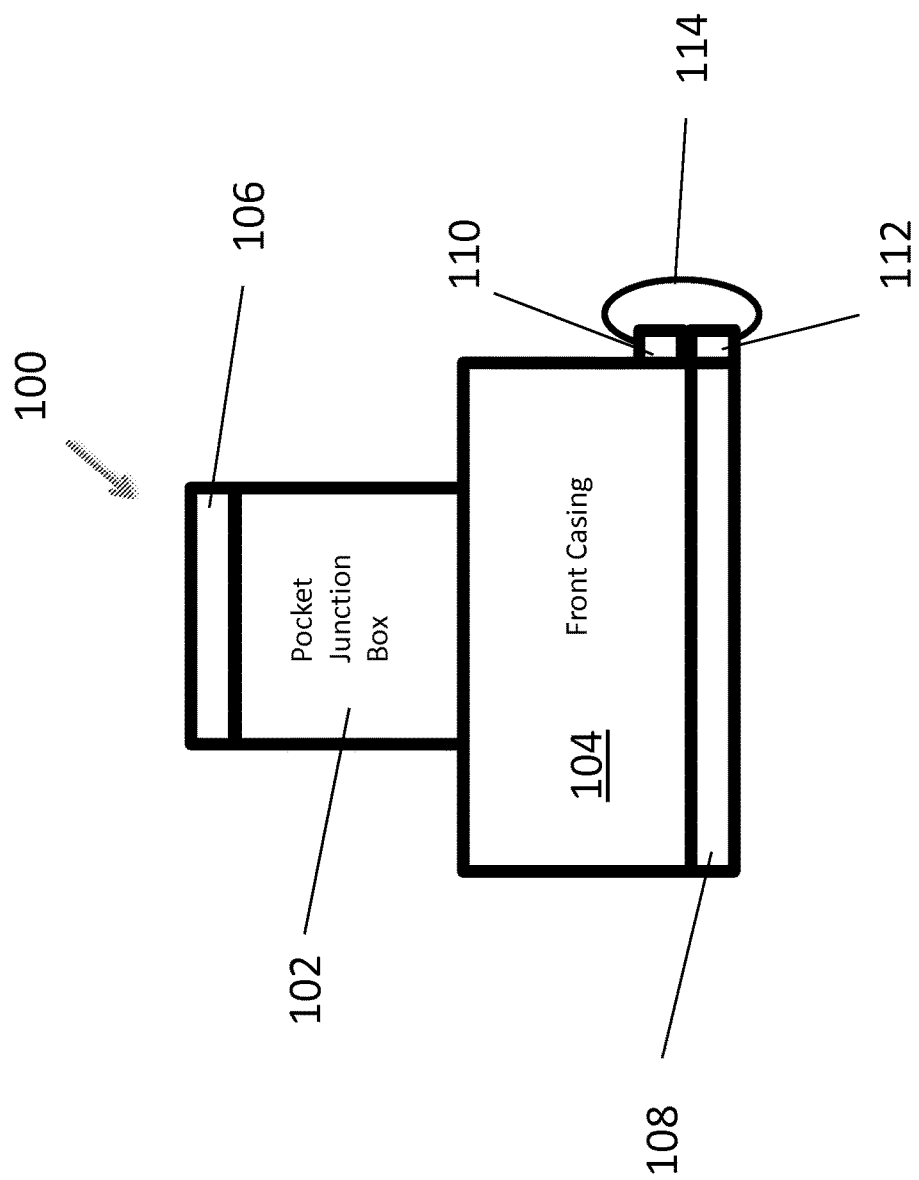
FIG. 1 shows a top view of an exemplary power junction box system that enables termination of field wiring in a meter collar.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

This disclosure is generally drawn to a pocket junction box system including a pocket junction box and a terminal block/strip. The pocket junction box includes integrated barriers, box lugs, bus bar, a sealing gasket, cover(s), current transformer(s), microcontroller, field swappable communications circuit board, and tamper evident sealable lid which may expose an electrical socket to receive a standard or custom plug carrying electrical energy or data. The pocket junction box is coupled with a terminal block/strip including receiving terminals for power and data connections.

FIG. 1 shows a top view of an exemplary pocket junction box system 100 that enables termination of field wiring in a meter collar. Pocket junction box 102 is connected to front casing 104 and to pocket junction box rear cover 106. Front casing 104 is covered by front casing cover 108. Tamper seal mount 110 on front casing 104 and tamper seal mount 112 on front casing cover 108 allow tamper seal wire loop 114 to secure front casing 104 to front casing cover 108 while providing evidence of tampering.

Figure 2:
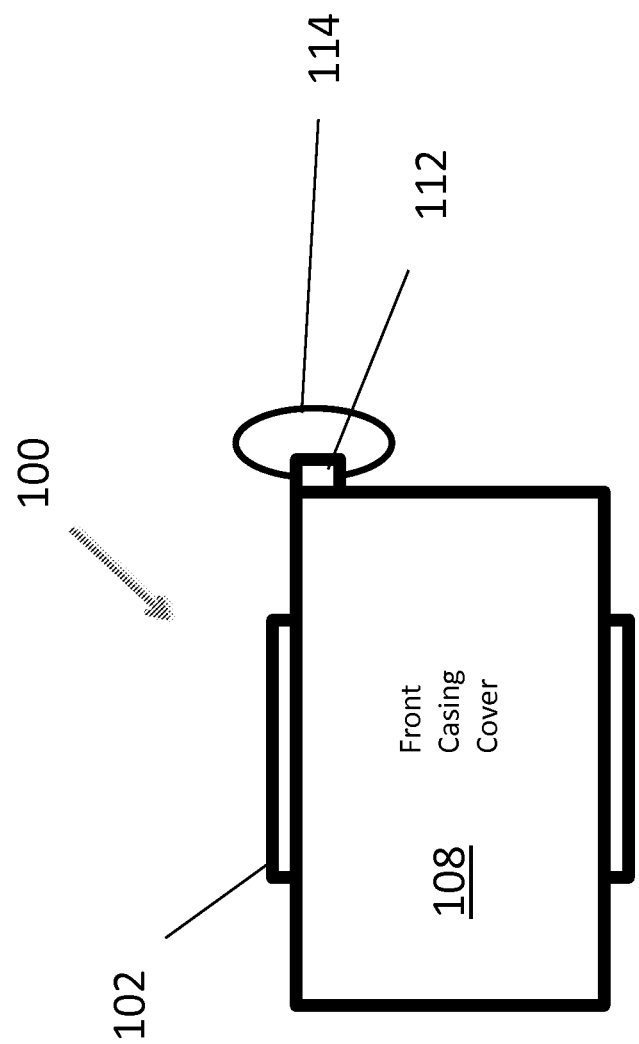
FIG. 2 shows a front view of an exemplary power junction box system that enables termination of field wiring in a meter collar.

FIG. 2 shows a front view of an exemplary pocket junction box system 100 that enables termination of field wiring in a meter collar. Pocket junction box 102 is barely visible behind front casing cover 108. Front casing 104 is not visible as it is obscured by front casing cover 108. Tamper seal mount 112 on front casing cover 108 has tamper seal wire loop 114 threaded through it. Tamper seal wire loop 114 also connects to the tamper seal mount on front casing 104, which is not visible.

Figure 3:
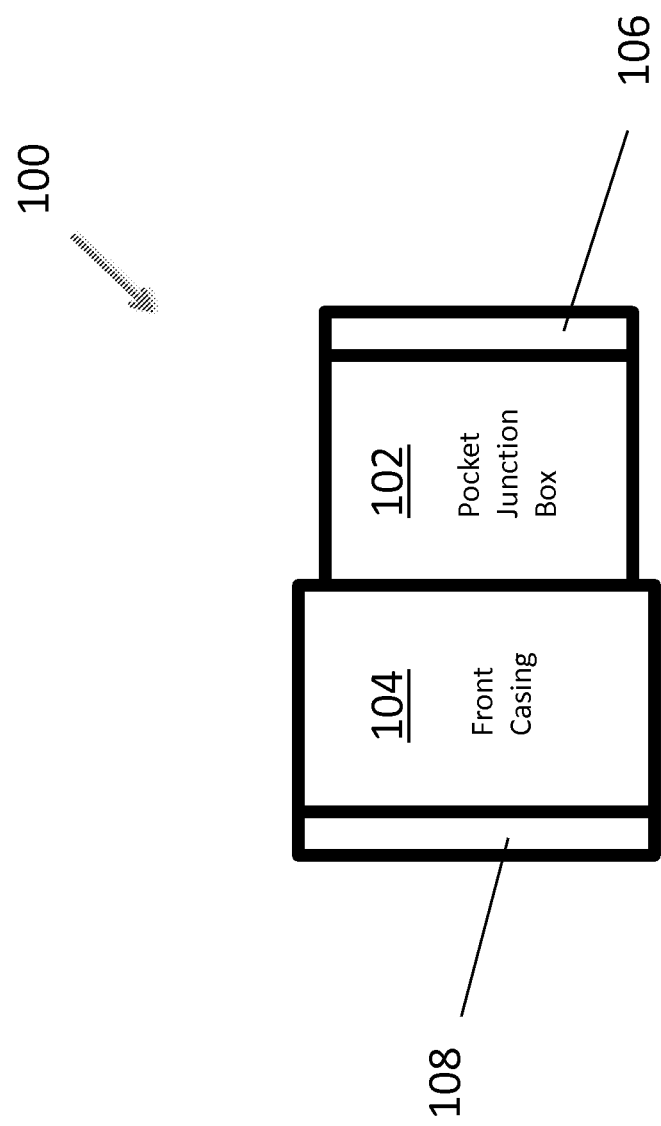
FIG. 3 shows a side view of an exemplary power junction box system that enables termination of field wiring in a meter collar.

FIG. 3 shows a side view of an exemplary pocket junction box system 100 that enables termination of field wiring in a meter collar. Pocket junction box 102 is connected to front casing 104 and to pocket junction box rear cover 106. Front casing 104 is covered by front casing cover 108.

Figure 4:
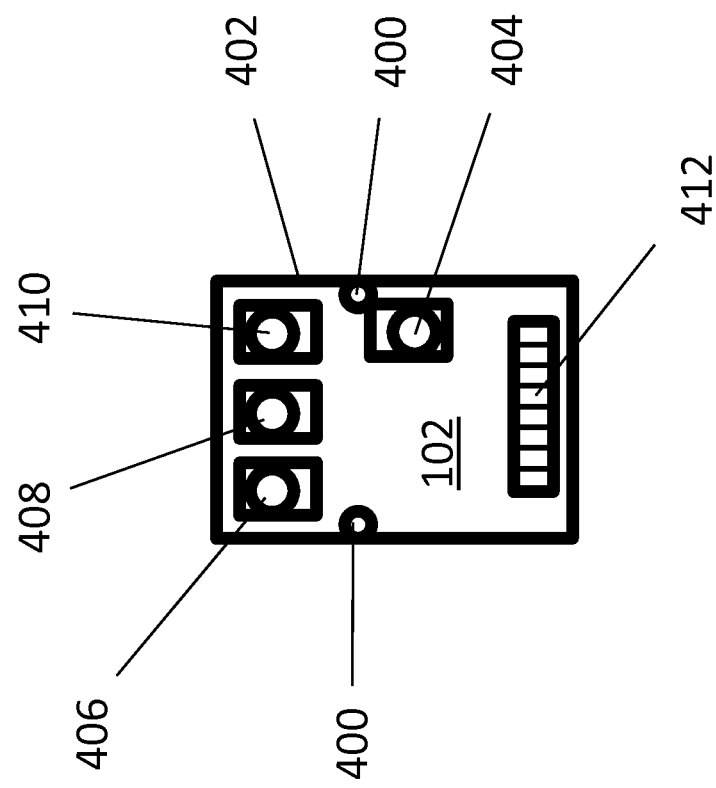
FIG. 4 shows a front view of an exemplary power junction box that enables termination of field wiring in a meter collar.

FIG. 4 shows a front view of an exemplary pocket junction box 102 that enables termination of field wiring in a meter collar. Pocket junction box 102 contains screw holes 400 for mounting to front casing 104 and compressing the gasket 402 that runs along the rim of pocket junction box 102 between the pocket junction box and front casing that provides weatherproofing. Electrical screw terminal block 404 allows for the connection of a ground wire. Electrical screw terminal block 406 and electrical screw terminal block 408 allow for the connection to different phases of active electrical voltage. Electrical screw terminal block 410 allows for connection to a neutral electrical wire. Data contact terminal 412 can interface with spring contacts on a printed circuit board mounted in the front casing 104.

Figure 5:
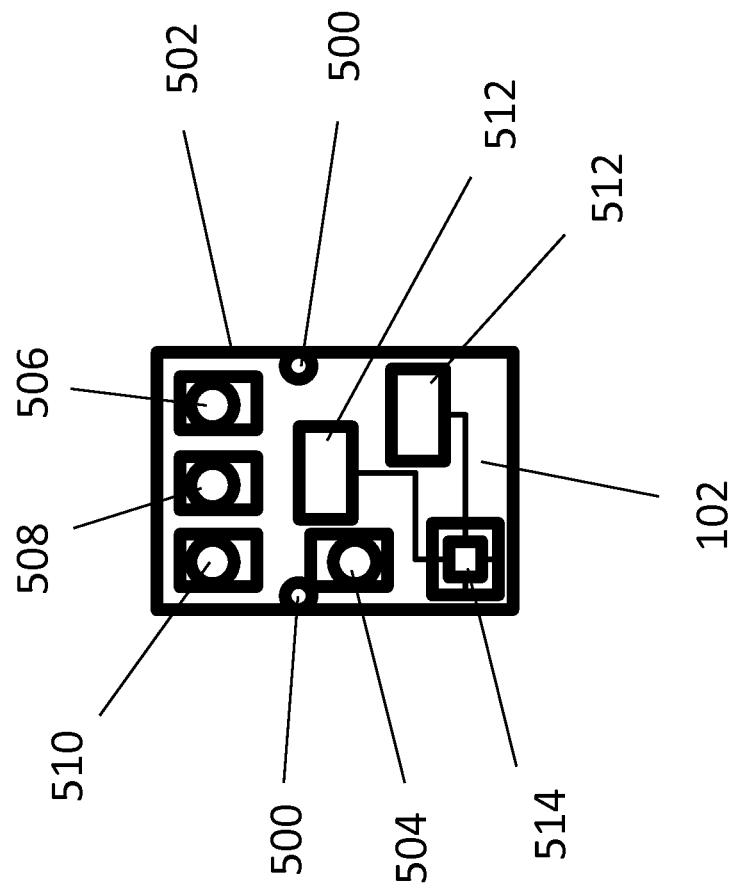
FIG. 5 shows a rear view of an exemplary power junction box that enables termination of field wiring in a meter collar.

FIG. 5 shows a rear view of an exemplary pocket junction box 102 that enables termination of field wiring in a meter collar. Pocket junction box 102 contains screw holes 500 for mounting to the pocket junction box rear cover 106 and compressing the gasket 502 that runs along the rim of pocket junction box 102 between the pocket junction box and rear cover 106 that provides weatherproofing. Several electrical screw terminal blocks allow an installer to connect electrical wiring on this side of the pocket junction box 102. Electrical screw terminal block 504 allows for the connection of a ground wire. Electrical screw terminal block 506 and electrical screw terminal block 508 allow for connection to different phases of active electrical voltage. Electrical screw terminal block 510 allows for connection to a neutral electrical wire. The active electrical voltage carrying wires that connect to electrical screw terminal block 506 and electrical screw terminal block 508 may each pass through one of the current transducers 512 for current measurement purposes. Current transducers 512 are connected to microprocessor 514 to monitor power measurements. Power measurement microprocessor 514 is also connected to electrical screw terminal block 506 and electrical screw terminal block 508 to monitor voltage on the active electrical voltage terminal blocks, as well as electrical screw terminal block 510, the neutral wire electrical screw terminal block, as a reference voltage. These electrical connections also provide power to power measurement microprocessor 514. Power measurement microprocessor 514 is connected to the data contact terminal 102 on the front of the pocket junction box 102 for data communication purposes.

Figure 6:
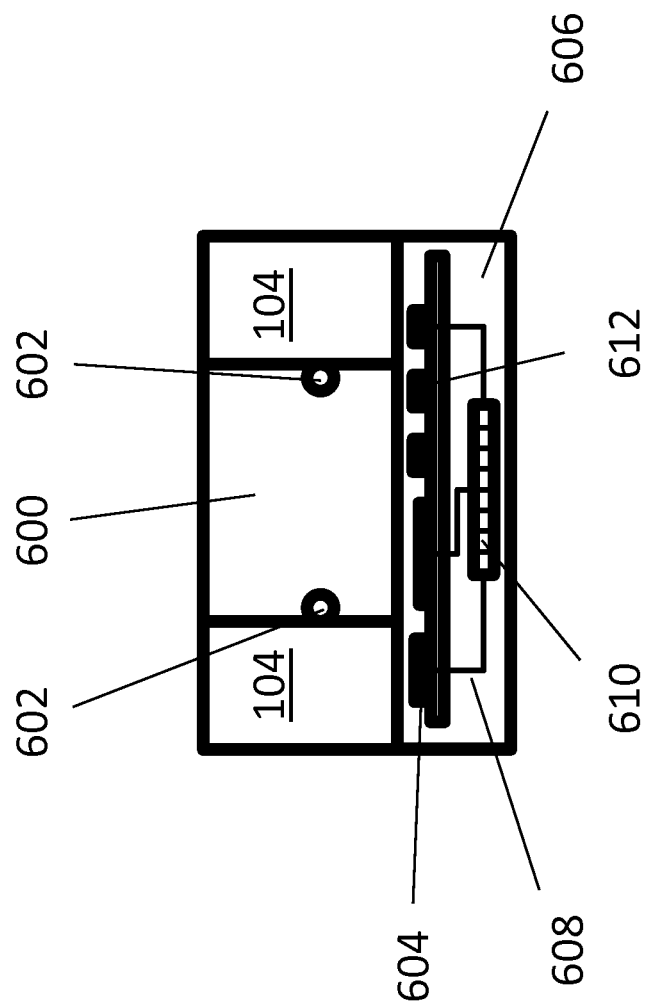
FIG. 6 shows a front view of a front casing of an exemplary power junction box system that enables termination of field wiring in a meter collar.

FIG. 6 shows a front view of a front casing 104 on an exemplary pocket junction box system 100 that enables termination of field wiring in a meter collar. Front casing 104 may have a gap cut out 600 that fits over pocket junction box 102. Screw holes 602 attach front casing 104 to pocket junction box 102 and compress the weatherproofing gasket attached to the pocket junction box. Communications printed circuit board 604 resides in printed circuit board compartment 606 and is connected by wiring 608 to the data contact terminal pin strip 610 that is a part of front casing 104. Communications printed circuit board 604 may communicate with a meter data management system either wirelessly or over a wired connection. Communications printed circuit board 604 may be swapped out while the pocket junction box system is connected to active electrical voltage by simply removing the front casing cover and sliding out communications printed circuit board 604 and replacing it with a new board. The printed circuit board may contain a data port 612 for receiving a standard data connection wire such as RJ-45. An installer may drill a hole in front casing 104 to attach electrical wiring to the electrical screw terminals and complete wiring to this side of the pocket junction box system. A plug and socket receptacle with wiring connections to the terminal block terminals 406, 408, 410, 404 and data port 612 may be mounted in the hole in lieu of permanent wiring.

Figure 7:
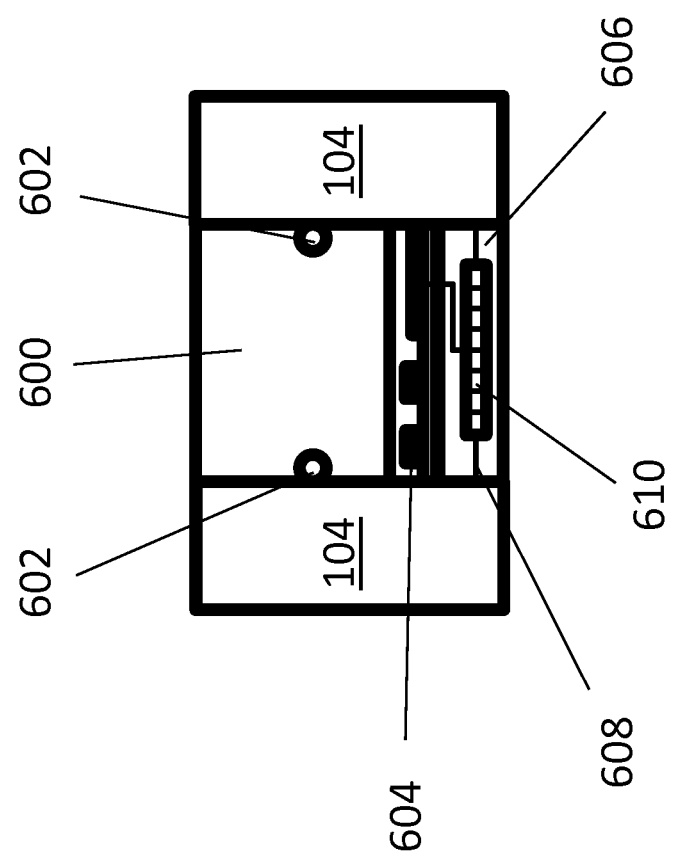
FIG. 7 shows a rear view of a front casing of an exemplary power junction box system that enables termination of field wiring in a meter collar.

FIG. 7 shows a rear view of a front casing 104 on an exemplary pocket junction box system 100 that enables termination of field wiring in a meter collar. Front casing 104 may have a gap cut out 600 that fits over pocket junction box 102. Screw holes 602 attach front casing 104 to pocket junction box 102 and compress the weatherproofing gasket attached to the pocket junction box. Communications printed circuit board 604 resides in printed circuit board compartment 606 and is connected by wiring 608 to the data contact terminal pin strip 610 that is a part of front casing 104. An installer may drill a hole in front casing 104 to attach electrical wiring to the electrical screw terminals and complete wiring to this side of the pocket junction box system.

Figure 8:
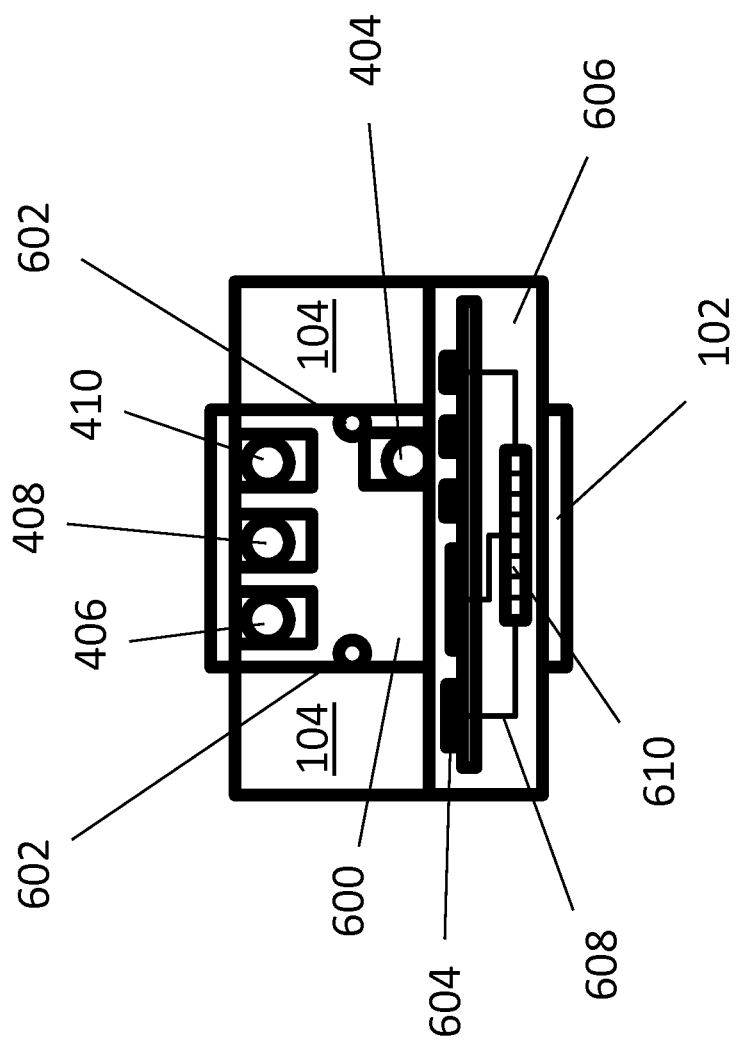
FIG. 8 shows a front view of a front casing mounted on an exemplary power junction box that enables termination of field wiring in a meter collar.

FIG. 8 shows a front view of a front casing 104 mounted on an exemplary pocket junction box 102 that enables termination of field wiring in a meter collar. Front casing 104 has a gap cut out 600 that fits over pocket junction box 102. Screw holes 602 attach front casing 104 to pocket junction box 102 and compress the weatherproofing gasket attached to pocket junction box 102. Communications printed circuit board 604 resides in printed circuit board compartment 606 and is connected by wiring 608 to the data contact terminal pin strip 610 that is a part of front casing 104. Communications printed circuit board 604 may be swapped out while the pocket junction box system is connected to active electrical voltage by simply removing the front casing cover and sliding out communications printed circuit board 604 and replacing it with a new board. Data contact terminal pin strip 610 is compressed against the data contact terminal 412 in pocket junction box 102 providing an electrical connection for the transmission of data signals between communications printed circuit board 604 and the microprocessor 514 that performs electrical power measurements mounted in the rear of pocket junction box 102. An installer may drill a hole in front casing 104 to attach electrical wiring to the active electrical voltage electrical screw terminals 406 and 408, neutral electrical screw terminal 410, and ground electrical screw terminal 404 to complete wiring to this side of the pocket junction box system.

Figure 9:
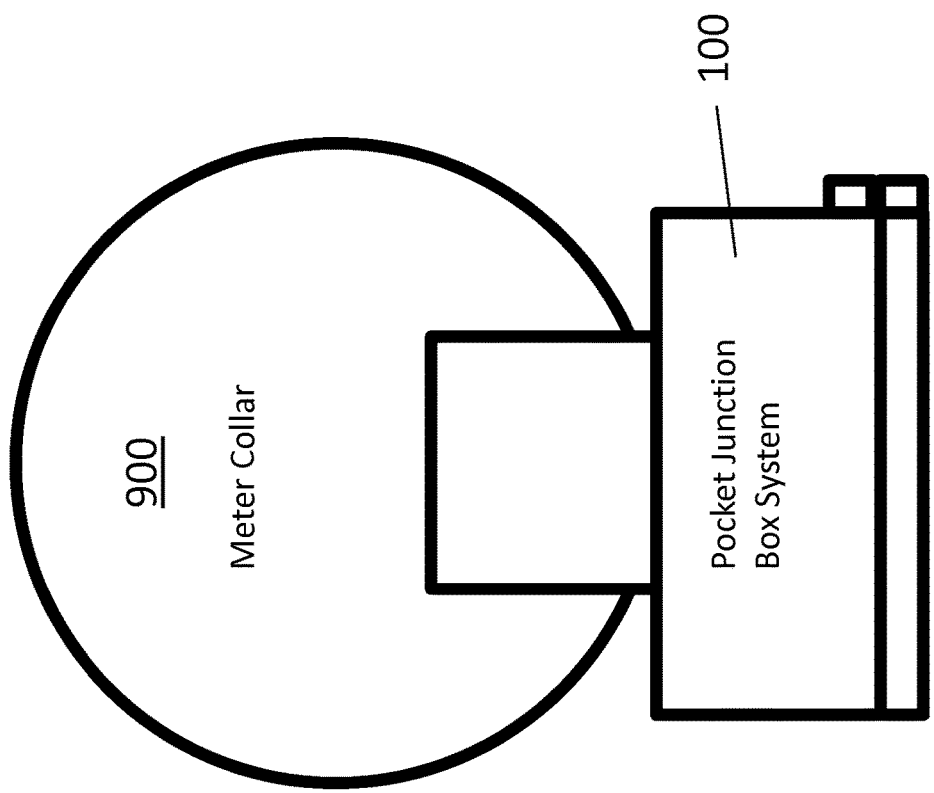
FIG. 9 shows a top view of an exemplary power junction box system mounted on a meter collar and that enables termination of field wiring in the meter collar.

FIG. 9 shows a top view of an exemplary power junction box system 100 mounted on a meter collar 900 and that enables termination of field wiring in the meter collar. Meter collar 900 has a recess to allow pocket junction box system 100 to mount inside of it. Pocket junction box system 100 can then be electrically wired to the bus bars and other wiring inside of meter collar 900.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A system, comprising:
   a pocket junction box that fits inside a meter collar, wherein the pocket junction box includes:
      a first set of electrical terminals on a rear surface of the pocket junction box for interfacing with wire leads connected to busbars inside the meter collar,
      a second set of electrical terminals on a front surface of the pocket junction box for interfacing with field wire leads outside the meter collar,
      at least one current transducer, and
      at least one microprocessor for monitoring the output of the at least one current transducer to measure the power flow through the pocket junction box; and
   a front casing attached to the front surface of the pocket junction box and connected to the second set of electrical terminals.

2. The system of claim 1, further comprising:
   a rear cover for covering the rear surface of the pocket junction box; and
   a front cover for covering a front surface of the front casing.

3. The system of claim 2, wherein the front cover includes a tamper resistant seal.

4. The system of claim 1, further comprising a gasket that forms a weatherproof seal between the pocket junction box and the front casing.

5. The system of claim 1, wherein the second set of electrical terminals includes a data contact terminal.

6. The system of claim 1, wherein the front casing includes a communications circuit board for communicating with a meter data management system.

7. The system of claim 6, wherein the communications circuit board can be removed while the system is connected to active electrical voltage and replaced with a second communications circuit board.

8. The system of claim 1, wherein the front casing includes an externally exposed socket to receive an electrical and/or data plug.

9. A pocket junction box that fits inside a meter collar, comprising:
   a first set of electrical terminals on a rear surface of the pocket junction box for interfacing with wire leads connected to busbars inside the meter collar;
   a second set of electrical terminals on a front surface of the pocket junction box for interfacing with field wire leads outside the meter collar;
   at least one current transducer; and
   at least one microprocessor for monitoring the output of the at least one current transducer to measure the power flow through the pocket junction box.

10. The pocket junction box of claim 9, wherein the second set of electrical terminals includes a data contact terminal.

11. The pocket junction box of claim 10, wherein the data contact terminal communicates with a meter data management system.

12. A meter collar, comprising:
   a pocket junction box positioned inside the meter collar, wherein the pocket junction box includes:
      a first set of electrical terminals on a rear surface of the pocket junction box coupled to busbars inside the meter collar,
      a second set of electrical terminals on a front surface of the pocket junction box for interfacing with field wire leads outside the meter collar,
      at least one current transducer, and
      at least one microprocessor for monitoring the output of the at least one current transducer to measure the power flow through the pocket junction box; and
   a front casing attached to the front surface of the pocket junction box and connected to the second set of electrical terminals.

13. The meter collar of claim 12, wherein the second set of electrical terminals includes a data contact terminal.

14. The meter collar of claim 12, wherein the front casing includes a communications circuit board for communicating with a meter data management system.

15. The meter collar of claim 12, further comprising:
   a rear cover for covering the rear surface of the pocket junction box; and
   a front cover for covering a front surface of the front casing.

16. The meter collar of claim 15, wherein the front cover includes a tamper resistant seal.

17. The meter collar of claim 12, further comprising a gasket that forms a weatherproof seal between the pocket junction box and the front casing.

* * * * *